(12) United States Patent
Ryu et al.

(10) Patent No.: US 9,203,370 B2
(45) Date of Patent: Dec. 1, 2015

(54) BROADBAND CIRCUIT AND COMMUNICATION APPARATUS INCLUDING SAME

(71) Applicant: EMW CO., LTD., Incheon (KR)

(72) Inventors: Byung Hoon Ryu, Seoul (KR); Won Mo Sung, Gyeonggi-do (KR); Yeon Sik Yu, Gyeonggi-do (KR); Ui Sheon Kim, Gyeonggi-do (KR)

(73) Assignee: EMW CO., LTD., Incheon (KR)

( * ) Notice: Subject to any disclaimer, the term of this patent is extended or adjusted under 35 U.S.C. 154(b) by 0 days.

(21) Appl. No.: 14/009,514

(22) PCT Filed: Dec. 18, 2012

(86) PCT No.: PCT/KR2012/011037
§ 371 (c)(1),
(2) Date: Oct. 2, 2013

(87) PCT Pub. No.: WO2013/105744
PCT Pub. Date: Jul. 18, 2013

(65) Prior Publication Data
US 2014/0327498 A1    Nov. 6, 2014

(30) Foreign Application Priority Data

Jan. 9, 2012   (KR) .................. 10-2012-0002276

(51) Int. Cl.
*H01Q 1/50*     (2006.01)
*H03H 7/01*     (2006.01)
(Continued)

(52) U.S. Cl.
CPC .............. *H03H 7/0115* (2013.01); *H01P 5/028* (2013.01); *H01Q 1/38* (2013.01); *H01Q 5/335* (2015.01); *H03H 7/0138* (2013.01); *H01Q 5/371* (2015.01); *H01Q 9/42* (2013.01)

(58) Field of Classification Search
CPC ....... H01Q 5/335; H01Q 5/371; H01Q 1/243; H03H 7/0115; H03H 7/0138
USPC .................... 343/850; 333/174, 167
See application file for complete search history.

(56) References Cited

U.S. PATENT DOCUMENTS 4,761,623 A * 8/1988 Schneider .................... 333/167
6,121,940 A * 9/2000 Skahill ..................... H01Q 9/00
                                                    343/701
(Continued)

FOREIGN PATENT DOCUMENTS

CN          1778014 A    5/2006
CN        101359918 A    2/2009
(Continued)

OTHER PUBLICATIONS

Office action from Chinese Intellectual Property Office (SIPO) in a counterpart Chinese patent application issued on Aug. 15, 2014.
(Continued)

*Primary Examiner* — Hoang V Nguyen
(74) *Attorney, Agent, or Firm* — The PL Law Group, PLLC

(57) ABSTRACT

A broadband circuit between an antenna operating in a first service band and a power feeding unit and allowing the antenna to operate in a second service band wider than the first service band, includes a first line connected to the power feeding unit, a second line connected to a ground surface, a first capacitor between the first and second lines, a third line connected to the ground surface and parallel to the first line, a fourth line connected to the antenna and parallel to the second line, a second capacitor between the first and third lines, a first inductor between the first and third lines and closer to the first and third lines than the third capacitor, a fourth capacitor between the second and fourth lines, and a second inductor between the second and fourth lines and closer to the second and fourth lines than the fourth capacitor.

10 Claims, 6 Drawing Sheets

(51) Int. Cl.
*H01Q 1/38* (2006.01)
*H01Q 5/335* (2015.01)
*H01P 5/02* (2006.01)
*H01Q 9/42* (2006.01)
*H01Q 5/371* (2015.01)

(56) References Cited

U.S. PATENT DOCUMENTS 8,203,400 B2 * 6/2012 Chen et al. .............. 333/181
2011/0291895 A1 12/2011 Zaila et al.

FOREIGN PATENT DOCUMENTS

| | | |
|---|---|---|
| JP | 2005-198167 A | 7/2005 |
| JP | 2005-311579 A | 11/2005 |
| JP | 2009-094564 A | 4/2009 |
| JP | 2011-244422 A | 12/2011 |
| KR | 10-2008-0040354 A | 5/2008 |
| KR | 10-2008-0086709 A | 9/2008 |

OTHER PUBLICATIONS

Office action from Japanese Intellectual Property Office (JPO) in a counterpart Japanese patent application.

* cited by examiner (a)

(b)

BROADBAND CIRCUIT AND COMMUNICATION APPARATUS INCLUDING SAME

CROSS REFERENCE TO RELATED APPLICATIONS AND CLAIM OF PRIORITY

This patent application is a National Phase application under 35 U.S.C. §371 of International Application No. PCT/KR2012/011037, filed 18 Dec. 2012, which claims priority to Korean Patent Application No. 10-2012-0002276, filed on 9 Jan. 2012, entire contents of which are incorporated herein by reference.

TECHNICAL FIELD

The present invention relates to a broadband circuit interposed between an antenna and a power feeding unit thereof, and a communication apparatus including the circuit.

BACKGROUND ART

Conventionally, penta-band antennas, which satisfy both a global system for mobile communications (GSM) quad band and a W2100 band, have been used for various communication apparatuses. An example of conventional antennas that satisfy the above-described characteristics will now be described.

FIG. 1 illustrates a conventional inverted F-type antenna 100 including a carrier 110 and a radiator 120. Since the antenna 100 is an inverted F-type antenna, a portion of the radiator 120 becomes a power feeding terminal 121 and a ground terminal 122. The power feeding terminal 121 is connected to a power feeding unit of a communication apparatus, and a ground terminal 122 is connected to a ground surface of the communication apparatus. The antenna 100 shown in FIG. 1 operates in a service band, namely, a GSM quad band and a W2100 band. In terms of frequency, it can be seen that the antenna 100 shown in FIG. 1 operates in a frequency band of about 824 MHz to about 960 MHz and a frequency band of about 1710 MHz to about 2170 MHz.

However, the introduction of an antenna that can satisfy both a GSM quad band and a W2100 band, and can also operate in a long-term evolution (LTE) band, has recently become needed. In particular, the design of an antenna whose operation band expands to an LTE 13 band of about 746 MHz to about 787 MHz is required. However, it is not easy to design a small-sized antenna having a size of about λ/4 or less to satisfy all the above-described service bands, because the following problems arise.

First, bandwidth increase and gain increase of an antenna are contrary to size reduction of the antenna. That is, it is very difficult to increase the bandwidth and gain of an antenna while also making it small. This is a problem because there is demand on the market for simultaneously reducing the size and increasing the bandwidth and gain of antennas.

Second, downsizing of antennas is problematic because it is difficult to cause resonance in a low-frequency band. A resonance frequency depends on the size of the antenna. As the resonance frequency becomes lower, the size of the antenna necessarily increases. Accordingly, when designing an antenna that operates in a frequency band lower than a GSM quad band, such as an LTE 13 band, the size of the antenna necessarily increases. Accordingly, it is difficult to embody a small-sized antenna.

Third, when a service band of an antenna partially expands, a conventionally designed antenna cannot be utilized as is. In other words, according to conventional art, an antenna designed to satisfy a GSM quad band and a W2100 band can be neither utilized as is nor designed to operate even in an LTE 13 band. Accordingly, expansion or change of a service band necessarily involves redesigning the antenna. However, when an antenna is redesigned from the beginning, since a conventionally designed antenna cannot be used as is, previously invested effort and capital cannot be utilized.

SUMMARY

The present invention is directed to providing technology that expands an operation bandwidth of an antenna by adding a circuit interposed between the antenna and a power feeding unit thereof.

The present invention is also directed to providing technology that expands an operation bandwidth of an antenna by adding only a circuit interposed between the antenna and a power feeding unit thereof, and reducing effort and cost required to separately redesign an antenna.

One aspect of the present invention provides a broadband circuit interposed between an antenna operating in a first service band and a power feeding unit thereof, and configured to allow the antenna to operate in a second service band that is wider than the first service band. The broadband circuit includes: a first line having one end connected to the power feeding unit; a second line having one end connected to a part of a ground surface; a first capacitor interposed between the other end of the first line and the other end of the second line; a third line having one end connected to the other part of the ground surface and being parallel to the first line; a fourth line having one end connected to the antenna and being parallel to the second line; a second capacitor interposed between the other end of the third line and the other end of the fourth line; a third capacitor interposed between the first and third lines; a first inductor interposed between the first and third lines and closer to the other ends of the first and third lines than the third capacitor; a fourth capacitor interposed between the second line and the fourth line; and a second inductor interposed between the second and fourth lines and closer to the other ends of the second and fourth lines than the fourth capacitor.

The broadband circuit may further include a first tuning element interposed between one end of the second line and a part of the ground surface.

The broadband circuit may further include a second tuning element interposed between one end of the third line and another part of the ground surface.

The first through fourth lines may be formed on a printed circuit board (PCB), and the first through fourth capacitors and the first and second inductors may be elements adhered to the PCB.

The first through fourth lines may be formed on a flexible PCB (FPCB), and the first through fourth capacitors and the first and second inductors may be elements adhered to the FPCB.

Another aspect of the present invention provides a communication apparatus including the broadband circuit.

According to an exemplary embodiment of the present invention as described above, a circuit capable of increasing the bandwidth of an antenna can be provided between the antenna and a power feeding unit thereof without modifying the design of a conventional antenna

DETAILED DESCRIPTION

Figure 1:
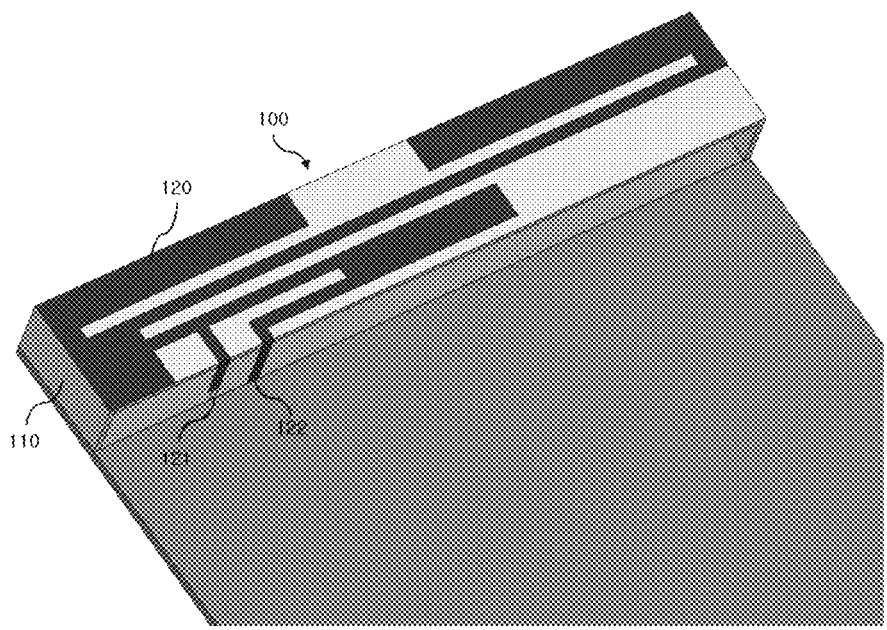
FIG. 1 is a perspective view of a conventional antenna.

While the invention can be modified in various ways and take on various alternative forms, specific embodiments thereof are shown in the drawings and described in detail below as examples. There is no intent to limit the invention to the particular forms disclosed. On the contrary, the invention is to cover all modifications, equivalents, and alternatives falling within the spirit and scope of the appended claims.

It will be understood that when an element is referred to as being "connected" or "coupled" to another element, it can be directly connected or coupled to the other element or intervening elements may be present.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, numbers, steps, operations, elements, and/or components, but do not preclude the presence or addition of one or more other features, numbers, steps, operations, elements, components, and/or groups thereof.

The present invention will now be described more fully with reference to the accompanying drawings, in which exemplary embodiments of the invention are shown. Descriptions of well-known components and processing techniques may be omitted to enhance clarity and conciseness.

Figure 2:
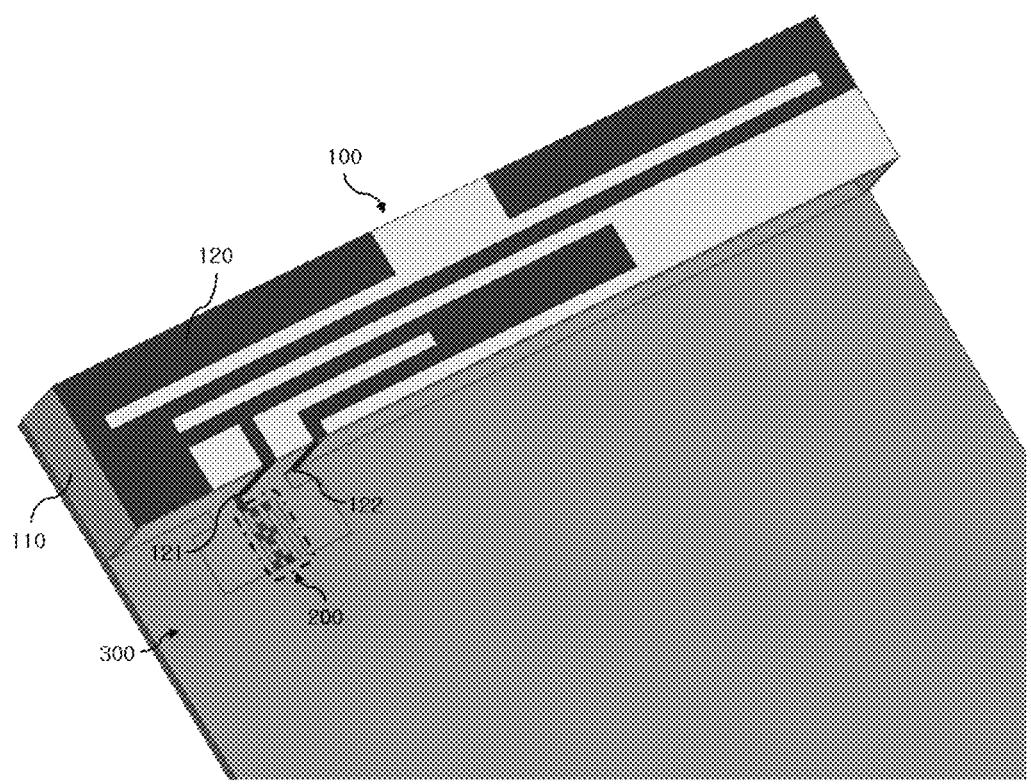
FIG. 2 is a perspective view of an antenna to which a broadband circuit according to an exemplary embodiment of the present invention is applied.
Figure 3:
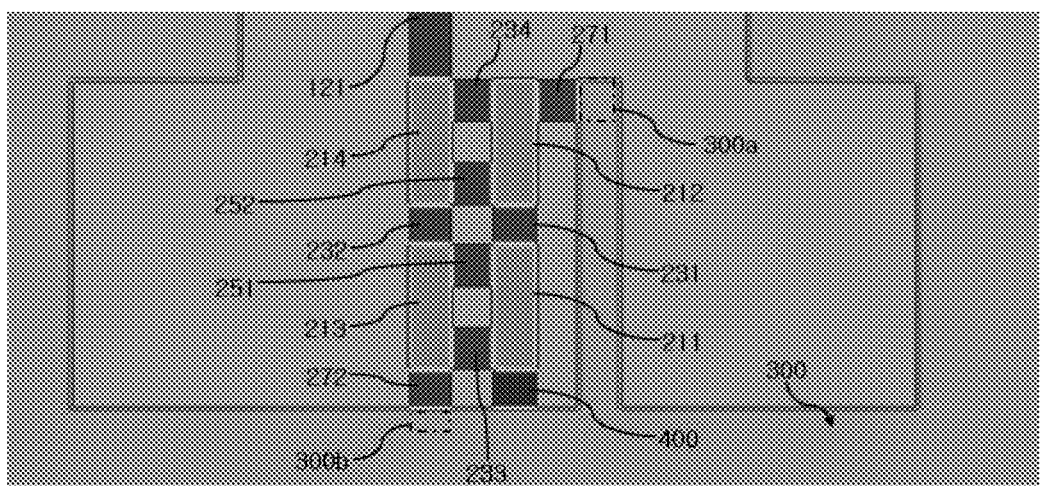
FIG. 3 is an enlarged perspective view of a broadband circuit according to an exemplary embodiment of the present invention.

FIG. 2 is a perspective view of an antenna to which a broadband circuit according to an exemplary embodiment of the present invention is applied. An antenna 100 shown in FIG. 2 includes a carrier 110 and a radiator 120. Since the antenna 100 is an inverted F-type antenna, a power feeding terminal 121 and a ground terminal 122 are formed at a part of the radiator 120. The power feeding terminal 121 is connected to the broadband circuit 200 according to one exemplary embodiment of the present invention, and the ground terminal 122 is connected to a ground surface of a communication apparatus. Although FIG. 3 illustrates an example in which an inverted F-type antenna is applied, an inverted L-type antenna or various other kinds of antenna may be applied. However, an antenna applied in the present invention is preferably a monopole antenna or an antenna having a modified monopole rather than a dipole antenna. By applying the above-described antenna, the broadband circuit according to the present invention may not operate as a balun circuit but serve to mediate unbalanced signals. Also, the antenna applied in the present invention is preferably a small-sized antenna having a size of λ/4 or less. Even if the broadband circuit according to the present invention is not applied to a large-sized antenna, there are various methods for increasing the bandwidth and gain of the large-sized antenna.

Meanwhile, the antenna 100 originally operates in a first service band. That is, a service band that is usable when the antenna 100 operates alone, without the broadband circuit according to the exemplary embodiment of the present invention, may be referred to as a first service band. Here, the first service band does not only refer to one service band and may include one or more service bands.

One object of the present invention is to allow the antenna 100 to operate in a second service band that is wider than the first service band. The object may be accomplished by interposing the broadband 200 according to the exemplary embodiment of the present invention between a power feeding unit 400 of a communication apparatus and the antenna 100.

Although the broadband circuit 200 may be provided as an independent component, the broadband circuit 200 is ultimately intended for application to the communication apparatus. Accordingly, in another exemplary embodiment of the present invention, a communication apparatus including the broadband circuit 200 to be described later is provided. That is, since the broadband circuit 200 according to the present invention is a circuit used for a communication apparatus requiring the antenna 100, the broadband circuit 200 according to the present invention may be applied to various communication apparatuses, such as a mobile communication terminal, a smartphone, and a laptop computer.

Below, a specific structure of the broadband circuit 200 aimed at meeting the above-described objects according to one exemplary embodiment of the present invention will be described.

Figure 4:
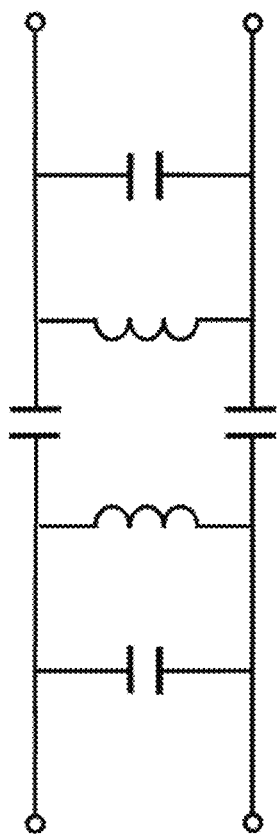
FIG. 4 is an equivalent circuit diagram of a broadband circuit according to an exemplary embodiment of the present invention.
Figure 4:
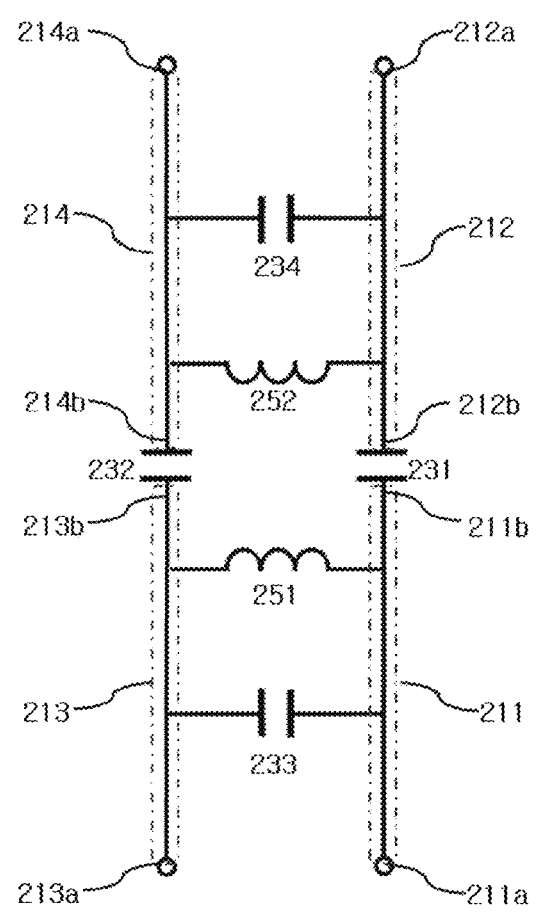

FIG. 3 is a specific illustration of a broadband circuit according to an exemplary embodiment of the present invention. FIG. 4 is an equivalent circuit diagram of a broadband circuit according to an exemplary embodiment of the present invention. (a) of FIG. 4 illustrates only an equivalent circuit, and reference numerals are added to (b) of FIG. 4 to correspond to FIG. 3.

Referring to FIGS. 3 and 4, the broadband circuit according to the exemplary embodiment of the present invention includes a first line 211, a second line 212, a third line 213, a fourth line 214, a first capacitor 231, a second capacitor 232, a third capacitor 233, a fourth capacitor 234, a first inductor 251, and a second inductor 252.

One end 211a of the first line 211 is connected to a power feeding unit 400, and the other end 211b thereof is connected to the first capacitor 231. One end 212a of the second line 212 is connected to a part 300a of a ground surface, and the other end 212b thereof is connected to the first capacitor 231. That is, the first capacitor 231 may be interposed between the other end 211b of the first line 211 and the other end 212b of the second line (212).

One end 213a of the third line 213 is connected to another part 300b of the ground surface, and the other end 213b thereof is connected to the second capacitor 232. One end 214a of the fourth line 214 is connected to a power feeding terminal 121 extending from an antenna 100, and the other end 214b thereof is connected to the second capacitor 232. That is, the second capacitor 232 may be interposed between the other end 213b of the third line 213 and the other end 214b of the fourth line (214).

The first line 211 and the third line 213 may be parallel to each other, and the second line 212 and the fourth line 214 may be parallel to each other. Here, being parallel to each other does not mean being physically completely parallel to each other. It may be inferred that respective lines are spaced apart from each other and extend.

The third capacitor 233 and the first inductor 251 are interposed between the first line 211 and the third line 213. The first inductor 251 is interposed between the first and third lines 211 to be closer to the other ends 211b and 213b of the first and third lines (211 and 213) than the third capacitor 233.

The fourth capacitor 234 and the second inductor 252 are interposed between the second line 212 and the fourth line 214. The second inductor 252 is interposed between the second and fourth lines 212 and 214 to be closer to the other ends 212b and 214b of the second and fourth lines (212 and 214) than the fourth capacitor 234.

To tune a resonance frequency of the antenna, a first tuning element 271 may be included between one end 212a of the second line 212 and the portion 300a of the ground surface. Also, a second tuning element 272 may be further included between one end 213a of the third line 213 and the other end 300b of the ground surface. Inductors may be used as the first and second tuning elements 271 and 272. By controlling an inductance of each of the inductors, a frequency band may be finely adjusted. Of course, the inductors are not necessarily used as the first and second tuning elements. In some cases, capacitors may be used instead of the inductors.

The first through fourth lines 211, 212, 213, and 214 may be formed on a printed circuit board (PCB). That is, conducting wires formed on the PCB may be used as the first through fourth lines. In this case, the first through fourth capacitors 231, 232, 233, and 234 and the first and second inductors 251 and 252 may be configured as the type of elements adhered to the PCB. For example, chips may be used.

Alternatively, the first through fourth lines 211, 212, 213, and 214 may be formed on a flexible PCB (FPCB). Alternatively, the first through fourth capacitors 231, 232, 233, and 234 and the first and second inductors 251 and 252 may be configured as the type of elements adhered to an FPCB. When a broadband circuit according to the present invention is formed in addition to a main circuit board of a communication apparatus, manufacture of the broadband circuit may be facilitated using an FPCB rather than using a typical PCB.

Below, effects of a case in which the broadband circuit 200 according to the exemplary embodiment of the present invention is applied will be described.

Figure 5:
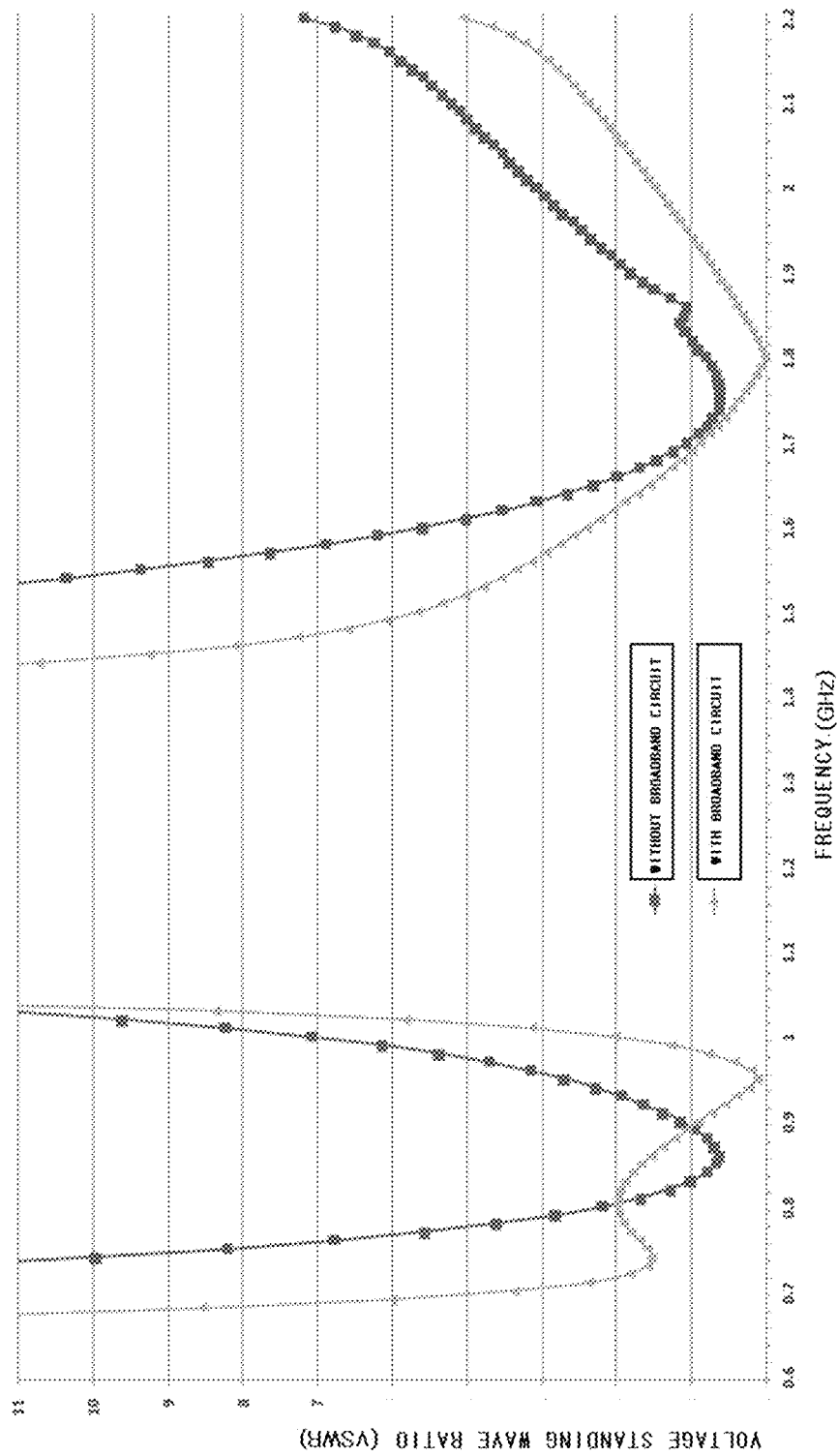
FIG. 5 is a graph comparing voltage standing wave ratio (VSWR) in a case in which a broadband circuit according to an exemplary embodiment of the present invention is applied and a case in which it is not applied.

FIG. 5 is a graph comparing voltage standing wave ratio (VSWR) in a case in which a broadband circuit according to an exemplary embodiment of the present invention is applied and a case in which it is not applied. Referring to FIG. 5, compared to the case in which only an antenna is applied without the broadband circuit, it can be confirmed that bandwidth generally expands when the broadband circuit is applied. In particular, it can be seen that a VSWR decreases to about 3 or lower even in an LTE 13 band of about 746 MHz to about 787 MHz.

Figure 6:
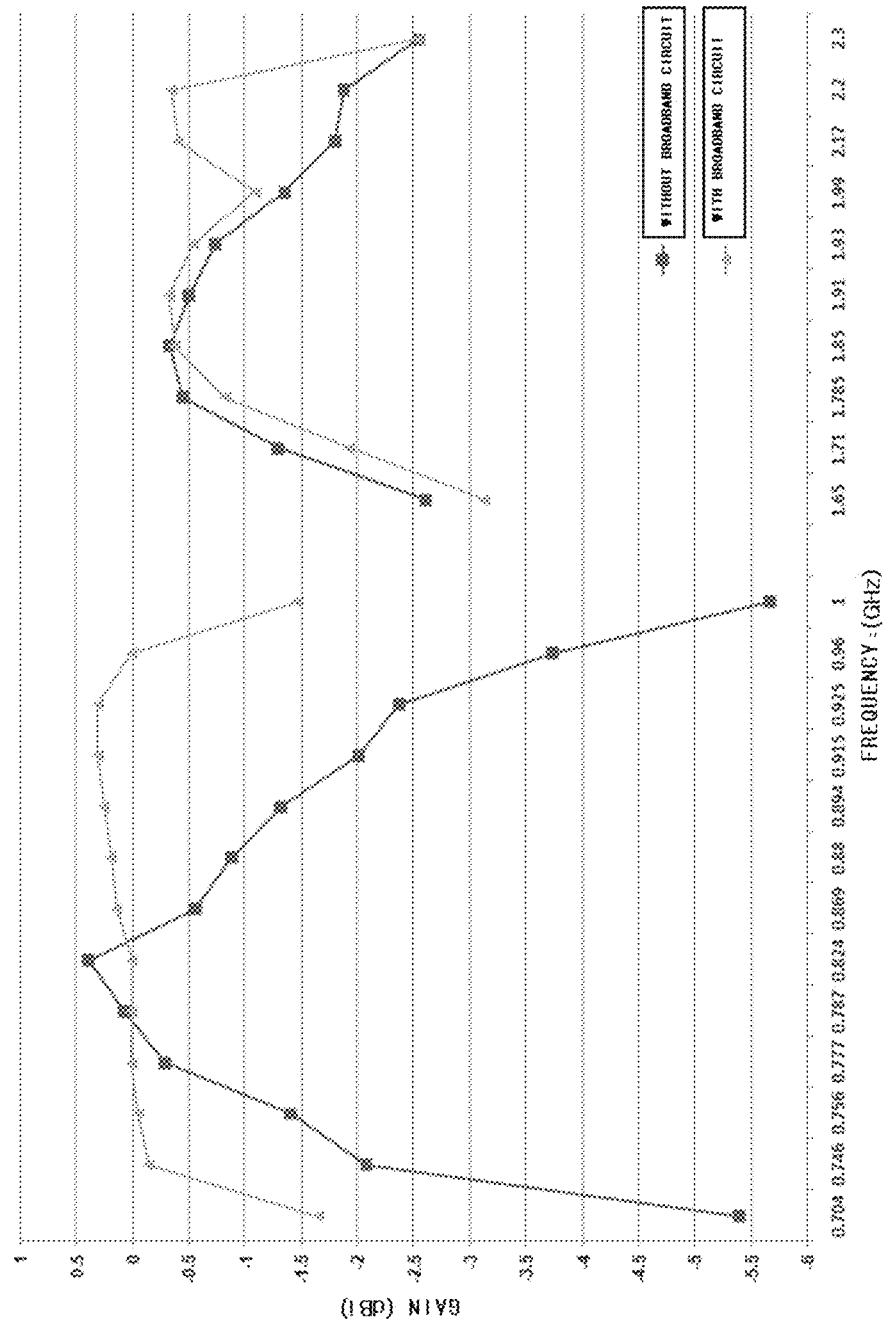
FIG. 6 is a graph comparing gain in a case in which a broadband circuit according to an exemplary embodiment of the present invention is applied and a case in which it is not applied.

FIG. 6 is a graph comparing gain in a case in which a broadband circuit according to an exemplary embodiment of the present invention is applied and a case in which it is not applied. Referring to FIG. 6, compared to the case in which only an antenna is applied without the broadband circuit, it can be confirmed that bandwidth generally expands when the broadband circuit is applied. Although gain decreases during a partial period, the reduction in gain does not fatally affect performance. Rather, it can be confirmed that gain markedly improves in an LTE 13 band of about 746 MHz to about 787 MHz.

To summarize the effects shown in FIGS. 5 and 6, when a broadband circuit according to an exemplary embodiment of the present invention is applied, even a service band in which the antenna 100 did not operate alone becomes a service band in which the antenna 100 can operate.

The above-described embodiment pertains to an example in which the first service band does not include an LTE 13 band, and the second service band includes an LTE 13 band.

However, the first service band and the second service band are not defined by the above-described embodiment. The above-described embodiment is only an example and the invention can naturally be applied to other service bands.

The reason why the above-described effects can be produced will now be described. In general, an antenna power feeding line has an impedance of about 50Ω. Accordingly, the size of a bandwidth within which mismatch between an antenna impedance corresponding to a load impedance and a power feeding line impedance corresponding to an input impedance can be made to match is a very important factor affecting antenna performance. When an impedance transformer is interposed between an antenna and a power feeding line to cause matching characteristics, signals are excited due to magnetic-field coupling of the impedance transformer. Thus, impedance matching is enabled within a wide bandwidth, like the impedance of the antenna, not an impedance of a specific frequency of the power feeding line, so that a bandwidth may expand. A broadband circuit according to the present invention may adopt the impedance transformer as a basic model and be embodied using only a capacitor and an inductor to increase bandwidth. That is, a predetermined circuit can be embodied by combining passive elements to form a broadband circuit.

By embodying the broadband circuit using the capacitor and the inductor, capacitance and inductance may be easily controlled compared to a case in which a typical impedance transformer is applied. Thus, a frequency can be easily changed according to a designer's intentions.

While this invention has been particularly shown and described with reference to exemplary embodiments thereof, it should be understood that the meanings of terms used in the description and the appended claims are not limited by common usage and dictionary definitions, but rather should be interpreted within the technical context of the present invention, based on the principle that the inventor is allowed to define terms as deemed appropriate to best explain the invention.

Therefore, the description given herein is just a preferred example for illustrative purposes only, and is not intended to limit the scope of the invention. It should be understood that various modifications and equivalent substitutions could be made therein without departing from the spirit and scope of the invention.

The invention claimed is:

1. A broadband circuit interposed between an antenna operating in a first service band and a power feeding unit thereof, and configured to allow the antenna to operate in a second service band that is wider than the first service band, the broadband circuit comprising:
   a first line having one end connected to the power feeding unit;
   a second line having one end connected to a part of a ground surface;
   a first capacitor interposed between the other end of the first line and the other end of the second line;

a third line having one end connected to the other part of the ground surface and being parallel to the first line;

a fourth line having one end connected to the antenna and being parallel to the second line;

a second capacitor interposed between the other end of the third line and the other end of the fourth line;

a third capacitor interposed between the first and third lines;

a first inductor interposed between the first and third lines and closer to the other ends of the first and third lines than the third capacitor;

a fourth capacitor interposed between the second line and the fourth line; and a second inductor interposed between the second and fourth lines and closer to the other ends of the second and fourth lines than the fourth capacitor.

2. The broadband circuit of claim 1, further comprising a first tuning element interposed between one end of the second line and a part of the ground surface.

3. A communication apparatus comprising the broadband circuit of claim 2.

4. The broadband circuit of claim 1, further comprising a second tuning element interposed between one end of the third line and another part of the ground surface.

5. A communication apparatus comprising the broadband circuit of claim 4.

6. The broadband circuit of claim 1, wherein the first through fourth lines are formed on a printed circuit board (PCB), and the first through fourth capacitors and the first and second inductors are elements adhered to the PCB.

7. A communication apparatus comprising the broadband circuit of claim 6.

8. The broadband circuit 1, wherein the first through fourth lines are formed on a flexible PCB (FPCB), and the first through fourth capacitors and the first and second inductors are elements adhered to the FPCB.

9. A communication apparatus comprising the broadband circuit of claim 8.

10. A communication apparatus comprising the broadband circuit of claim 1.

* * * * *